United States Patent [19]
Menezes

[11] Patent Number: 5,286,306
[45] Date of Patent: Feb. 15, 1994

[54] THIN FILM PHOTOVOLTAIC CELLS FROM I-III-VI-VII COMPOUNDS

[76] Inventor: Shalini Menezes, P.O. Box 5132, Thousand Oaks, Calif. 91358-0532

[21] Appl. No.: 832,420

[22] Filed: Feb. 7, 1992

[51] Int. Cl.⁵ .............. H01L 31/072; H01L 31/075; H01L 31/18
[52] U.S. Cl. .................... 136/249; 136/264; 136/265; 257/184; 257/458; 437/5; 427/74; 427/76; 205/157; 205/915
[58] Field of Search ......... 136/252, 264, 265, 249 TJ; 357/16, 30 B, 30 E, 30 J, 61; 437/5; 205/157, 915; 427/74, 76; 423/472, 508; 257/431, 458, 461, 76, 184

[56] References Cited

U.S. PATENT DOCUMENTS

| | | | |
|---|---|---|---|
| 4,710,589 | 12/1987 | Meyers et al. | 136/258 PC |
| 4,753,684 | 6/1988 | Ondris et al. | 136/258 PC |

Primary Examiner—Aaron Weisstuch

[57] ABSTRACT

A photovoltaic energy conversion device and methods for forming the same with relatively high efficiency, high stability, low cost, low weight, and low toxicity. The device comprises a thin film n/p or n/i/p type, gradient-doped heterojunction which uses compatible, lattice-matched, non-hazardous semiconducting compounds from the $I-III-VI_2$ (14), I-III-VI-VII (15) and $I-VI_3-VII$ (16) series, an ohmic contact (13) to the n-layer comprising a group III metal, a transparent ohmic contact (17) to the p-layer, a grid (18), and an antireflection coating (20).

20 Claims, 4 Drawing Sheets

THIN FILM PHOTOVOLTAIC CELLS FROM I-III-VI-VII COMPOUNDS

BACKGROUND OF THE INVENTION

This invention relates to a photovoltaic (PV) energy conversion device, specifically a thin film n/p or n/i/p heterojunction with graded carrier concentration, using semiconducting compounds from the I-III-VI$_2$, I-III-VI-VII and I-VI$_3$-VII series. It relates further to methods of manufacturing the cells, directed to producing a cell, especially an indium-tin-oxide (ITO)/n-CuInSe$_2$/i-CuIn$_x$Se$_y$I$_z$/p-CuSe$_3$ cell, with relatively high efficiency, high stability, low cost, and low toxicity.

Photovoltaic cells offer the prospect of a more benign and renewable source of power than either fossil or nuclear systems. The criteria for a successful photovoltaic device are high energy conversion efficiencies, long-term stability and low cost. The high efficiency solar cells are based on monocrystal absorbers, for example, Si, GaAs, InP, and CdTe, which require high energy, labor, and highly purified materials. The less expensive amorphous Si cell is unstable and less efficient. CuInSe$_2$ meets the criteria of low cost, high efficiency, stability, and environmental safety. It has thus emerged as the most promising material for terrestrial and space applications. It is a direct band gap semiconductor with a low minority carrier diffusion length, a high absorption coefficient, and a steep absorption edge. These attributes permit fabrication of lightweight, low material-usage thin film cells; its radiation hardness ranks CuInSe$_2$ ahead of Si and GaAs for space use.

In the prior art, p-CuInSe$_2$ has been used in thin film Mo/p-CuInSe$_2$/n-CdS/ZnO cells (p-CIS) by various workers. U.S. patents to Mickelson et al (1980) U.S. Pat. Nos. 4,335,266, 4,465,575; Kapur et al (1986) U.S. Pat. No. 4,581,108, Ermer et al (1989) U.S. Pat. No. 4,798,660 provide background information on the development of the p-CIS cell. Numerous deposition techniques have been employed, including: (a) selenization of Cu/In layers; (b) evaporation (thermal, electron-beam, sputtering or ion plating); (c) electrodeposition; (d) chemical spraying; (e) screen printing; (f) sintering; and (g) laser annealing. The description of these methods and the resulting films along with references are summarized by Zweibel et al (1989), Chopra and Das (1983). The key processes that have yielded high quality p-CIS films are co-evaporation of Cu, In, and Se, and selenization of electron beam deposited Cu and In layers. Although single junction efficiencies in the range of 14% have been recently reported, the sensitivity of cell performance to several processing steps and safety issues associated with some cell components continue to be of serious concern and have hindered its commercialization. For example:

(i) the toxicity of the CdS window component has been the primary deterrent in its terrestrial use (Cd and its compounds present health, safety and environmental hazards, e.g. Moskowitz et al (1990));

(ii) the Mo contacts to p-CuInSe$_2$ affect the mechanical stability (poor adhesion) and the performance of the cell, possibly due to the formation of a layered compound, MoSe$_2$, at the interface. Mo is also toxic to some degree;

(iii) interdiffusion of Cu and Cd at the heterojunction interface can induce conductivity type inversion in thin films of p-CuInSe$_2$ which could undermine the cell stability, especially in radiative environments;

(iv) lattice mis-match of 1.2% between CuInSe$_2$ and CdS increases interface state density, leading to efficiency losses due to the associated recombination.

The n-CuInSe$_2$ material has not been employed in a thin film photovoltaic cell for two reasons: (a) first, the difficulties encountered in preparing non-resistive n-CuInSe$_2$ films, e.g. Thornton (1987) indicated that the deposition of In-rich films by reactive sputtering in H$_2$Se medium led to In rejection; other workers have noted similar In rejection for the co-evaporation and in the e-beam deposition/selenization methods. Noufi et al (1987) reported the formation of highly compensated and resistive n-type films by co-evaporation. Similarly synthesized films were unsatisfactory even after vacuum annealing at high temperatures in the presence of Cd or In, according to Haneman (1990); and (b) the second reason was the lack of a highly conducting and transparent p-type window, as most wide bandgap materials, e.g. oxides, are n-type.

Nevertheless, high efficiency photoelectrochemical cells with n-CuInSe$_2$ single crystal were reported by Menezes et al (1983, 1984, 1986) and by Cahen (1984). Our U.S. Pat. No. 4,601,960 (1986) describes the first n-CuInSe$_2$ photoelectrochemical cell that was stabilized from corroding in the electrolyte by inducing the growth of a new semiconducting interphase from the corrosion products. The n-CuInSe$_2$ single crystal based solar cell with a CuSe$_3$ interfacial film was 12.2% efficient and stable. An energy difference between the work functions of CuInSe$_2$ and CuSe$_3$ suggested the possibility of a buried p/n heterojunction between the two materials. Although our approach at surface stabilization was reproduced by various other workers, no further evidence of a solid state junction was reported. Thus, no solid state cell has been constructed primarily because (c) large single crystal CuInSe$_2$ substrates are difficult to fabricate and impractical for scale-up and (d) since CuInSe$_2$ thin films tend to corrode and peel off the substrate during surface conversion in the electrolyte.

The uncertainties regarding the existence of a solid state junction persisted because of the above mentioned difficulties in verifying the concept of a buried p/n junction. These difficulties also prevented the construction of a practical photoelectrochemical cell. In general, the utility of photoelectrochemical cells is limited by several engineering constraints:

(e) Inflexible cell design;

(f) Susceptibility to leaks and corrosion at the various inherent solid/liquid interfaces;

(g) Uncertain long-term stability of the electrolyte/semiconductor interface in hostile environments; and (h) Need for expensive bulk (thick) single crystal or polycrystalline CuInSe$_2$ substrates which are not economical in terms of material and energy usage, and unsuitable for large area applications (Single crystal grain size rarely exceeds 2 cm$^2$).

SUMMARY OF THE INVENTION

Accordingly, the object of this invention is to provide a new lightweight, large area thin film solar energy conversion device with compatible, non-hazardous components and potentially lower cost, higher efficiency and stability than prior art. The new device combines the optimum PV properties of CuInSe$_2$, the advantages of a thin film cell configuration and the non-toxic cell components synthesized in our previous photoelectrochemical cell and eliminates the disadvantages of the thin film p-CIS and single crystal or polycrystalline n-CIS photoelectrochemical cells. The preferred embodiment consists of ITO, n-CuInSe$_2$ absorber, CuIn$_x$Se$_y$I$_z$ transition layer, p-CuISe$_3$ window, transparent ohmic contact, and antireflection coating. The invention is distinctly different from either the p-CIS thin film cell or n-CIS photoelectrochemical cell and offers several advantages over the prior art. Distinctions/Advantages over Thin Film p-CuInSe$_2$/n-CdS Cell (U.S. Patents to Mickelson et al U.S. Pat. Nos. 4,335,266, 4,465,575; Kapur et al U.S. Pat. No. 4,581,108; Ermer et al U.S. Pat. Nos. 4,798,660, 4,611,091). These include:

(a) n-CuInSe$_2$ absorber which may be more efficient due to the higher mobility of electrons;

(b) Two new environmentally-acceptable window materials to replace the highly toxic CdS (window) component. Thus the production of hazardous materials and waste is minimized;

(c) Perfect lattice match between CuInSe$_2$ and CuIn$_2$ISe$_3$ layers, which minimizes lattice distortion and interface state density, and contributes to high efficiency;

(d) More stable heterojunction due to similar components (except I) on both sides of the junction;

(e) ITO back contact provides better adhesion to n-CuInSe$_2$ as compared to that between p-CuInSe$_2$ and Mo in the prior art;

(f) An innovative approach: a simple, inexpensive, room temperature electrochemical method to form a n/p heterojunction, in which surface layers of n-CuInSe$_2$ absorber film are electrochemically converted to a p-type window; this approach used for the preferred embodiment minimizes energy usage and material waste, eliminates expensive vacuum deposition equipment, waste disposal, and simplifies large scale manufacturing; and (g) Tailored heterostructure, n+-n-i-p-p+: the combination of ITO back contact and the electrochemical surface conversion create regions of high carrier density adjacent to ohmic contacts and a region of high resistivity in the space charge region.

Distinctions/Advantages over the photoelectrochemical or solid state n-CIS prior art, U.S. Pat. No. 4,601,960 to Menezes et al. These include:

(a) ITO back contact replaces the toxic Hg-In amalgam;

(b) Intrinsic layer, e.g. CuIn$_x$Se$_y$I$_z$, not specified in the prior art;

(c) Transparent conducting oxide front contact to the p-layer since Au forms a barrier with p-CuISe$_3$ and also reflects a large fraction of the incident light;

(d) Eliminates the etching steps, required to remove damaged layers from the mechanically sliced single crystal or polycrystalline wafers; also reduces material waste;

(e) Thin film (<5 μm thick) substrate is cost effective in terms of CuInSe$_2$ material and energy usage relative to the thick (>200 μm) single crystal or polycrystalline substrate;

(f) Amenable to large area fabrication (m$^2$ for thin film as compared to mm$^2$ for single crystal);

(g) Eliminates leaks and sealing problems inherent in photoelectrochemical cells;

(h) Amenable to flexible thin film technology;

(i) Amenable to lightweight space technology; and (j) Low cost processing of the thin film photoactive layer relative to single crystal or polycrystalline bulk materials.

Further advantages of this invention will become apparent from consideration of the drawings and ensuing description.

DETAILED DESCRIPTION OF THE INVENTION

Figure 1:
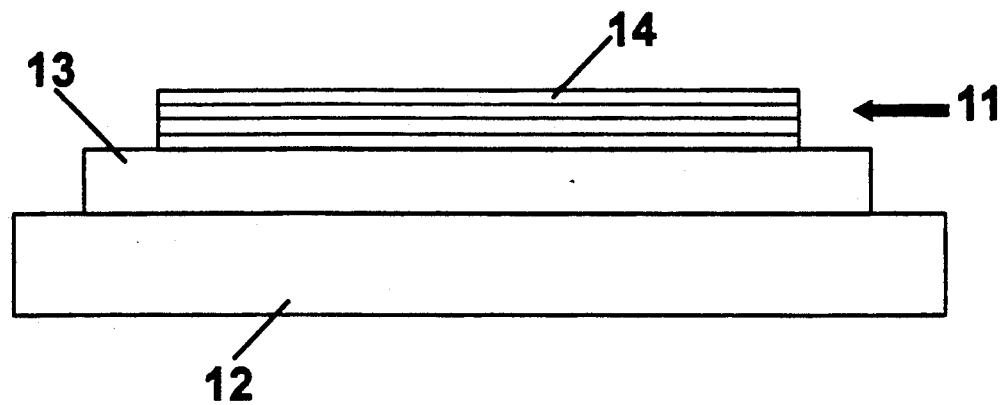
FIG. 1 shows a precursor part, comprising a substrate, an ITO film and, an n-type film.

FIG. 1 shows the precursor part 11 of the cell, comprising a substrate 12, a back ohmic contact 13, and the n-type photoactive film 14. The substrate 12 serves as a backing to support the electroactive layers of the cell. Depending on the application and the method used for depositing the active layers, the substrate 12 may be a rigid or flexible and/or transparent, lightweight, insulating material, e.g. glass, alumina, plastics. For example, a front-wall illuminated cell will require a transparent glass substrate with an antireflection coating, while a high specific-power cell for space surface power application will use a lightweight, flexible, plastic substrate.

Layer 13 serves as the ohmic contact to the absorber (n-CuInSe$_2$) layer 14. The deposition method used to synthesize the CuInSe$_2$ layer has a direct bearing on selection of the ohmic contact material. In conjunction with the selenization (of Cu/In alloy) method described by Basol et al (1989), ITO is the preferred back-ohmic contact. ITO coated glass substrates are commercially available. ITO may be deposited by sputtering or other vacuum methods. Another indium compound or an indium alloy or another group III element may be substituted for ITO. Layer 13 is one of the key elements of this invention. Besides providing an ohmic contact layer 14, layer 13 provides better mechanical adhesion between layers 12 and 14 relative to the Mo contact in the prior art; more importantly it induces n-type conductivity and graded doping in the layer 14. Note that another back-contact material, e.g. Mo, can be substituted in conjunction with other deposition techniques, e.g. co-evaporation, where the deposition rate of the elements can be precisely controlled to yield the desired stoichiometry and grading in the CuInSe$_2$ layer.

Layer 14 is the photoactive component of the cell selected from the I-III-VI$_2$ series, e.g. CuInSe$_2$. This layer is synthesized by selenization of I-III precursor alloy. Basol et al (1989) have described this method in the prior art for synthesis of p-CuInSe$_2$ films on Mo coated substrates. The modification in this invention includes an ITO coated substrate, a Cu/In ratio of 0.95–1.00 in the film and thickness between 3–5 microns. By maintaining the ratio of depositing source metals, i.e. a Cu/In ratio close to 1, an average ratio of about 0.9 will be obtained in the deposit. The diffusion of In from layer 13 into the CuInSe$_2$ film during its synthesis alters the film stoichiometry by decreasing the Cu/In ratio, producing n-type conductivity and a composition gradient in the film. The region of layer 14 adjacent to layer 13 will thus have a higher dopant concentration (n+), enabling a better ohmic contact with layer 13, while the outer layers with low impurity concentration will remain conveniently resistive. It should be pointed out that decreasing the Cu/In ratio alone leads to segregation of the InSe phase leading to inhomogeneous, highly resistive material. The ITO back contact is crucial to the engineering of the film conductivity. Since the i-CuIn$_x$Se$_y$I$_z$/p-CuISe$_3$ layers are grown by electrochemically anodizing a portion of layer 14, this film has to be thicker than prior art p-CIS films.

Figure 2:
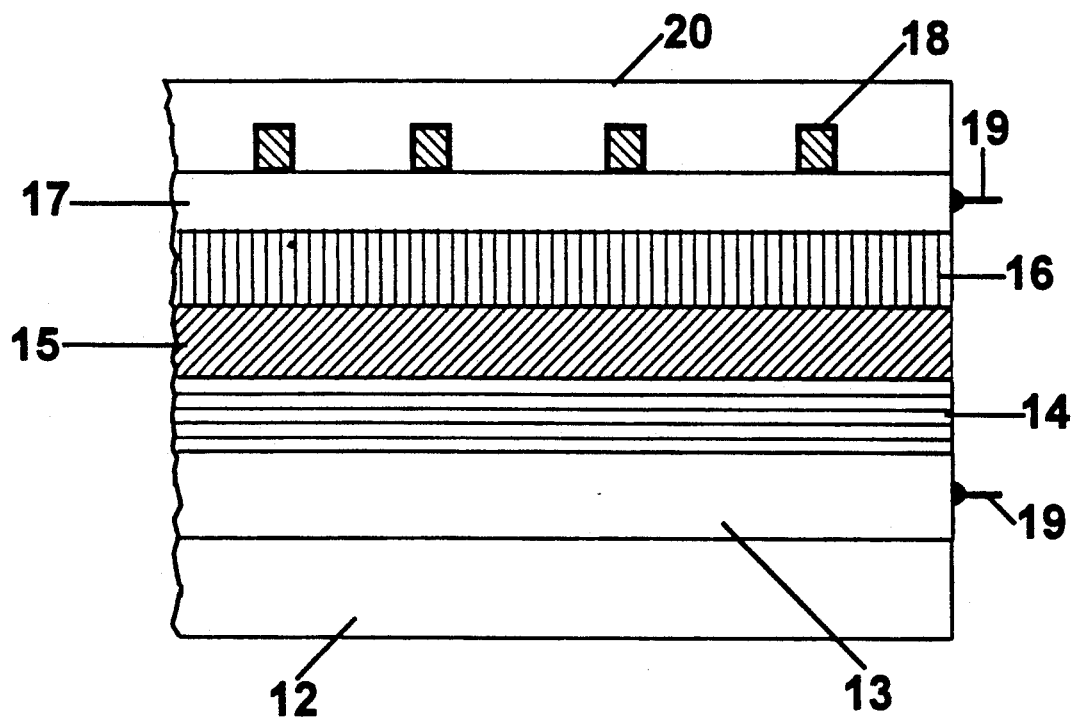
FIG. 2 is a sectional schematic view of a thin cell embodying components of the present invention including the precursor part, a transition layer, a p-type window layer, a transparent conducting oxide, a metal grid contact, and antireflection coating. The dotted lines representing the interfaces between the layers indicate diffuse interfaces due to composition gradients.

The inventive device of the present example is schematically represented in FIG. 2. Layer 15 is the transition layer between two semiconductors, i.e. n-CuInSe$_2$ and p-CuISe$_3$ with well defined composition and conductivity type. Layer 15 is a quaternary material, I-III-VI-VII, comprising elements from both adjacent layers 14 and 16. In the present example layer 15 is believed to be a high resistivity, nearly intrinsic material, CuIn$_x$-Se$_y$I$_z$, with a graded composition, such that, x decreases while y and z increase away from layer 14 relative to the Cu concentration. This layer serves as a low doped material in the depletion region.

Layer 16 is the p-type semiconductor window, selected from the series I-VI$_3$-VII, which in the present example is p-CuISe$_3$. It contains excess Se which dopes it p+ to avoid series resistance near the front contact. Layers 15 and 16 together are less than a micron thick, to increase transmission of the incident light to the absorber, 14. These layers serve as the heterojunction partner for the n-type absorber layer 14 creating a diffusion potential within the heterojunction. The n/i/p heterojunction is annealed for approximately 10 min in air at about 150° C.

A highly conductive transparent electrode 17 is used to facilitate current collection from the p-type layer 16. It may be made up of a transparent conducting oxide such as ZnO or SnO$_2$. Since these oxides are n-type, they have to be substantially degenerate or highly doped to eliminate the formation of a rectifying junction with the p-CuISe$_3$ layer 16. The need for layer 17 depends on the morphology and the conductivity of layer 16, which in turn depends on the deposition process employed. A grid of contact metal, 18 e.g. Cu, Au, or Al may supplement layer 17 or be used directly over layer 16 if this layer 16 is highly conducting. The metal grid 18 may be deposited by evaporation, sputtering, or electroplating. Conducting metal power output wires 19 are conductively bonded to contacts 13 and 17 (or 18). The inventive device can operate in either front-wall (illuminated though layer 13) or backwall (illuminated through layer 16) mode if transparent ohmic contacts are employed. A commercial antireflection coating 20 such as 'Corning' glass or oxide of Si, Al, or Ta, deposited on the outermost cell component, 12, 17 or 18, that is exposed to illumination 28, completes the device.

Figure 3:
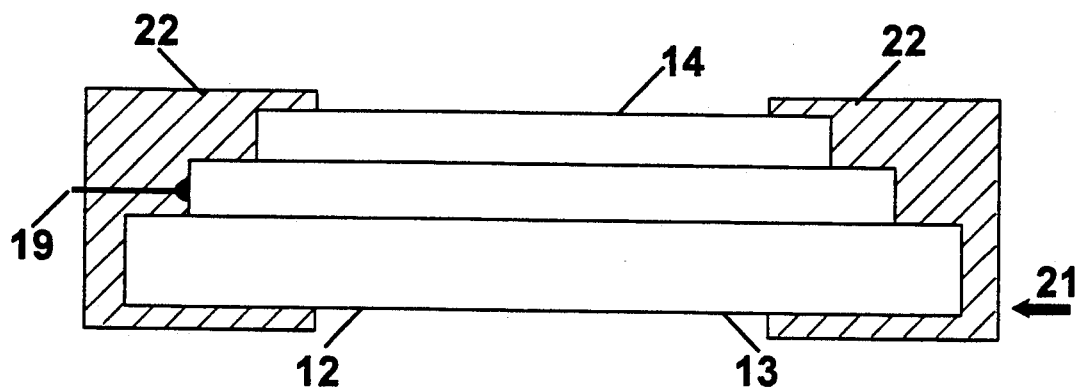
FIG. 3 shows the precursor part 1 with edges encapsulated with an inert insulating material, for immersion in an electrolyte.

Prior to electrochemical surface conversion the precursor electrode 11 is prepared, as shown in the in the part 21 modification of FIG. 3. The exposed edges of contact 13 and a portion of the connecting wire 19 are encapsulated with a removable insulating lacquer or wax 22, e.g. Turco mask, photoresist, that is chemically inert in the electrolyte.

Figure 4:
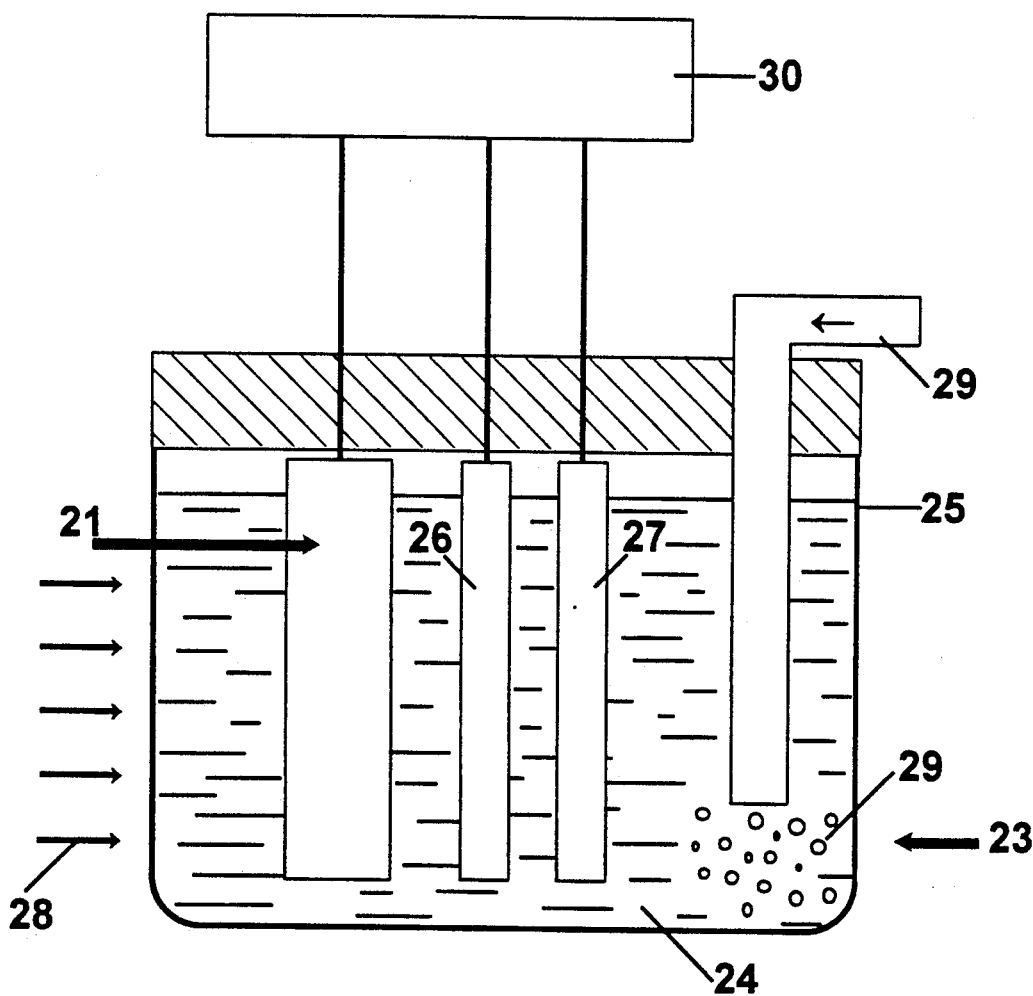
FIG. 4 shows a laboratory scale electrochemical cell to convert the surface of n-CuInSe$_2$ surface to i-CuIn$_x$Se$_y$I$_z$/p-CuISe$_3$.

The insulated precursor electrode 21 is then immersed in the electrochemical cell 23 containing a liquid electrolyte 24, comprising approximately 2M I−, 50 mM I$_2$, 50 mM CuI, and 4M HI, so that the surface of layer 14 is in contact with the electrolyte 24 as shown in FIG. 4. The electrolyte composition is similar to the prior art, U.S. Pat. No. 4,601,960 to Menezes (1986), but the procedure and the concentrations are modified. The electrolyte container 25 is preferably a rectangular quartz cell or a conventional cell provided with a quartz window of area that is greater than the exposed surface of layer 14. A counter electrode 26 and a reference electrode 27, made of an inert metal or carbon, are included in the electrochemical cell 23. The reference electrode 27 sets the reference voltage for the electrode 21 at the redox potential ($V_R$) of the electrolyte. The cell photovoltage, $V_{CELL}$, is given by the open-circuit voltage, $V_{OC}$, of electrode 21 with respect to $V_R$, under illumination. The cell is illuminated with solar or simulated white light 28 in order to produce anodic current in the n-type layer 14. The electrolyte 24 is de-aerated by bubbling nitrogen gas 29. The electrodes are connected to a potentiostat 30.

Layer 14 is photoanodized in electrolyte 24 by potentiostatically cycling the electrode between $V_R$ and $V_{OC}$ and/or holding it at a fixed potential between these two limits for 10–20 minutes, depending on the current density. A slow rate of film growth using low illumination (<100 W/cm$^2$) and low anodic current (<10 mA/cm$^2$) is preferred to reduce the rate of growth and improve the morphology of layer 15.

Figure 5:
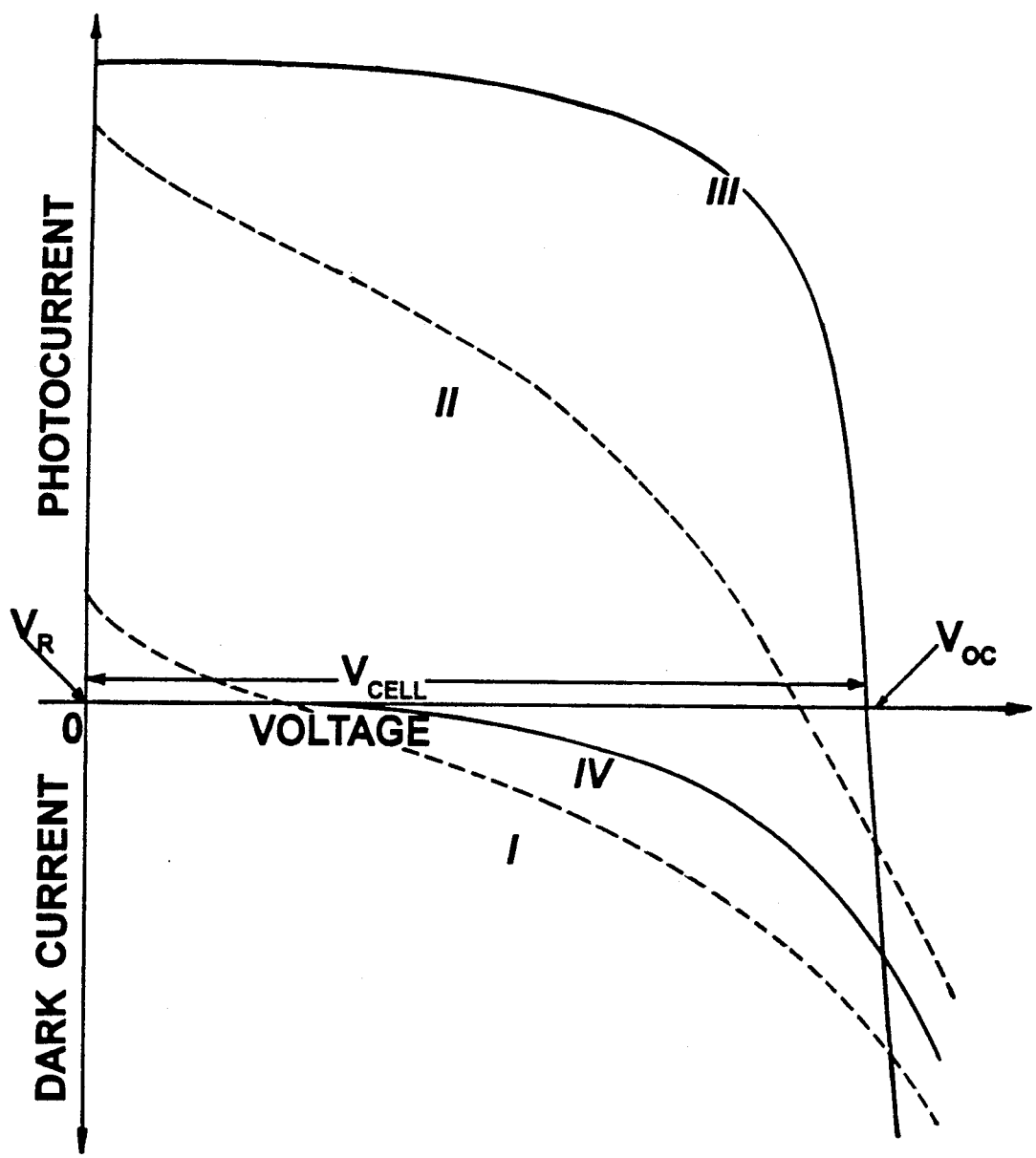
FIG. 5 shows typical current-voltage characteristics of the sample in FIG. 1, before and after surface conversion.

The quality and conversion of the layer 14 surface and the quality of the n/i/p junction are monitored in-situ by measuring the current(I)-voltage(V) output shown in FIG. 5. Curve I shows the dark I-V output. Any anodic current if observed in the dark is attributable to pin-holes or shunts in the layer 14. Curve II showing the initial I-V curve of the thin film 14 indicates a relatively poor quality junction between the thin film 14 and the electrolyte 24. Growth of layers 15 and 16 by photoanodization leads to an increase in photocurrent, photovoltage ($V_{OC}-V_R$) and the fill factor, as shown in curve III. The dark current, curve IV, is also lower since the growth of layers 15 and 16 seals the pores in film 14. The electrode is then removed from the electrolyte, rinsed in distilled water, and dried with nitrogen gas. The encapsulant is removed by peeling off the wax or dissolving the photoresist in a solvent, e.g. acetone.

Figure 6:
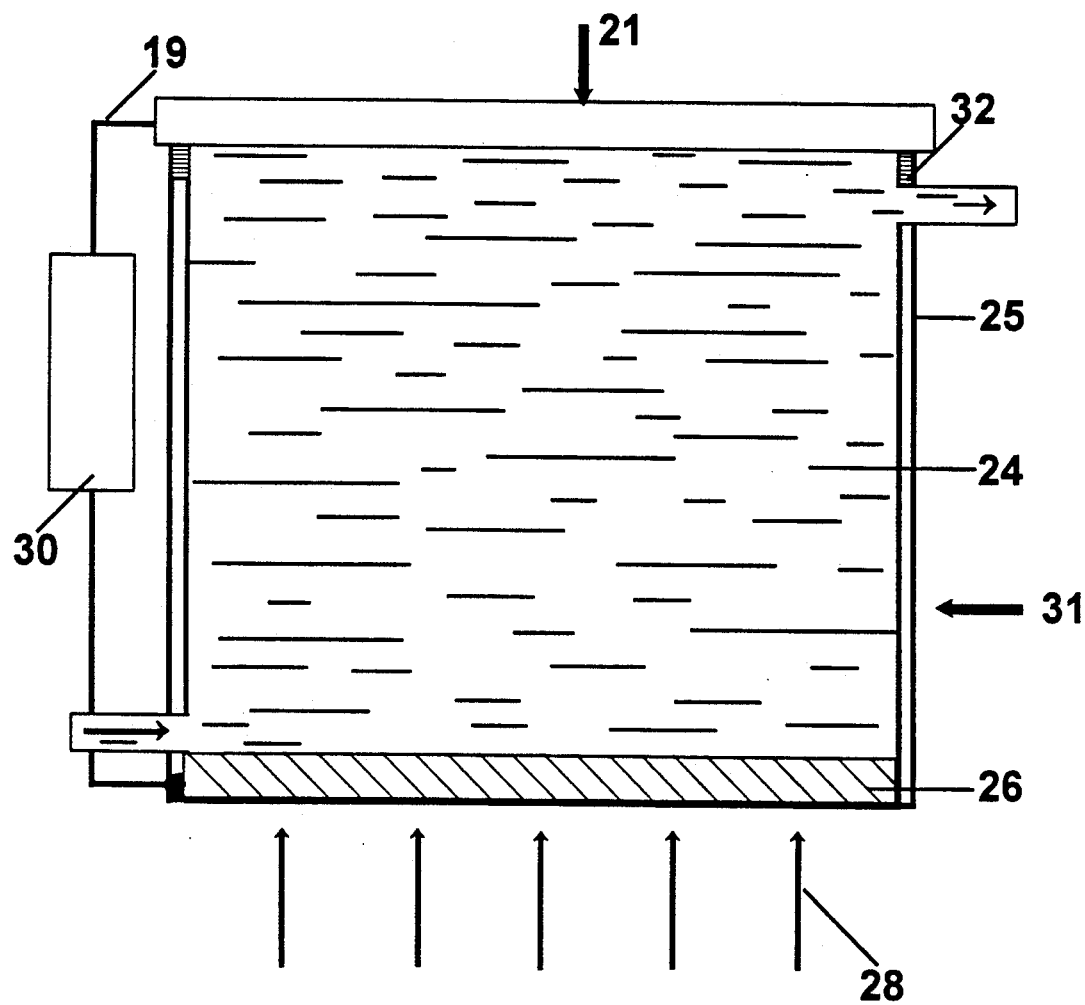
FIG. 6 shows an alternate electrochemical cell for converting a large sample, embodiment of FIG. 1 in the liquid electrolyte.

FIG. 6 shows an alternate electrochemical cell 31 for surface conversion using precursor electrode 21. This method may be scaled up for fabrication of large area cells. The steps of encapsulation and its removal are eliminated in this version. Electrode 21 is mounted on top of the container 25 filled with the electrolyte 24. Contact between the electrode surface and the electrolyte is attained by a capillary action. A soft plastic or rubber gasket 32 is inserted between the electrode and the top of the container 31. An inlet and an outlet to the container 25 are provided to enable electrolyte 24 circulation, deareation, or the elimination of air bubbles at the surface of the electrode 21. Layer 14 is illuminated from the bottom through a metal mesh counter electrode 26. With minor modification of the cell 31, bottom or side mounts for the electrode 21 can be implemented for convenience. For example, the current distribution can be optimized by changing the geometry of electrode 24. Thus the anodization can be performed galvanostatically, thereby eliminating the reference electrode 27.

CONCLUSIONS, RAMIFICATIONS AND SCOPE

It is evident from the above description that the inventive cell will provide highly efficient, reliable, low-cost photovoltaic energy conversion device for space missions or for terrestrial power systems. Alternate thin film deposition methods described in the reference by Chopra and Das (1983) may be used to synthesize the layers 14, 15, and 16. Prior art methods used to synthesize p-$CuInSe_2$ thin films, particularly those listed in the reference by Zweibel et al (1989), are incorporated in this patent by reference to synthesize layers 14, 15, and 16. The additional criteria in employing the prior art methods (except for co-evaporation) for synthesis of the n-$CuInSe_2$ layer 14, include replacing the Mo back contact with an ITO (or its analogues) contact 13 and maintaining the ratio of Cu/In reactants close to one. Each of the prior art deposition processes used to synthesize $CuInSe_2$ thin films offer specific advantages and disadvantages. Preferences of one over the other will depend on the criteria or requirements of specific application of the device. For example, processing and cost advantages, and amenability to large area fabrication are important considerations for large scale terrestrial PV applications where electrodeposition is more appropriate. Electrodeposition can be used either to deposit the precursor Cu/In films or the $CuInSe_2$ compound with appropriate modifications in the deposition parameters to produce an n-$CuInSe_2$ layer.

For space applications, where reliability, low weight and efficiency precede the cost factor, high quality n-$CuInSe_2$ thin films may be more effectively synthesized by using the technique of co-evaporation of the constituent elements, Cu, In, and Se, or the constituent compounds $Cu_2Se$ and $In_2Se_3$. This technique can be further adapted to sequentially synthesize layers 15 and 16 in an integrated evaporation system, comprising Cu, In, I, and Se sources. The vapor pressure of volatile materials like I and Se is lowered by keeping the I and Se sources at low temperatures. The I-source is shut off during synthesis of layer 14. All four sources are used to deposit layer 15. The in-source is shut off during deposition of layer 16. Since almost analogous elements constitute the three layers, the same chamber can be used to synthesize the heterojunctions in-situ thus minimizing fabrication costs, particularly for large area applications. The process parameters can be adjusted as required to produce the desired stoichiometry for each layer.

Similarly, an integrated system may be used to sputter deposit the three layers 14, 15, and 16. Either RF-magnetron or DC-magnetron sputtering can be used with Cu, In, Se, $Cu_2Se$, $In_2Se_3$, CuI, $CuInSe_2$, $CuSe_3$, and $CuIn_2Se_3I$ targets. A reactive gas such as $H_2Se$ is introduced as the Se source. Iodine can also be introduced as a reactive vapor or as HI.

$CuSe_3$ and $CuIn_2Se_3I$ compounds can be synthesized as polycrystalline bulk materials from stoichiometric melts of CuI and Se, and of CuI and $In_2Se_3$, respectively. The melt technique involves heating the reactant materials in vacuum to above the melting point of the compound and allowing the melt to crystallize during a slow cooling process. Bulk $CuSe_3$ and $CuIn_2Se_3I$ materials can serve as targets to sputter deposit thin films or as small area device components.

Many other variations of the above described device are possible such as: (a) Back-wall or front-wall configuration cell; (b) $CuInSe_2$ homojunction cell; (c) cascade or multijunction cells; or (d) p-$CuInSe_2$/ $CuIn_xSe_yI_z$/n-type window(e.g. CdS, ITO) cells. The two new semiconductors $CuSe_3$ and $CuIn_2Se_3I$ may be used in conjunction with other photovoltaic materials or electronic devices.

The above described configurations and various methods used to deposit the cell components illustrate some of the preferred embodiments, adapted to specific applications. The scope of the invention is to be limited only by the following claims. From the above discussion, many variations will be apparent to one skilled in the art that would yet be encompassed by the spirit and scope of the invention.

REFERENCES CITED

U.S. PATENT DOCUMENTS

U.S. Pat. No. 4,335,266—December, 1980—Mickelson et al
U.S. Pat. No. 4,581,108—April, 1986—Kapur et al
U.S. Pat. No. 4,601,960—July, 1986—Menezes et al
U.S. Pat. No. 4,611,091—September, 1986—Choudary et al
U.S. Pat. No. 4,798,660—January, 1989—Ermer et al

OTHER PUBLICATIONS

Basol B. M. et al, *Solar Cells*, 27, 299 (1989).
Cahen D. et al, *Appl. Phys. Lett.*, 45, 746 (1984).
Chopra K. L. and Das S. J. 'Thin Film Solar Cells', p. 195-274, Plenum Press (1983).
Hahn H. et al, *Z. Anorg. Chem.*, 303, 107 (1950).
Haneman D., *Thin Solid Films*, 163, 167 (1990).
Menezes S. et al, *Nature*, 30, 615 (1983).
Menezes S., *Appl. Phys. Lett.*, 45, 148 (1984).
Menezes S., *Solar Cells*, 16, 255 (1986).
Moskowitz P. D. et al, SERI/TR-211-3621, (1990).
Noufi R. et al, *Solar Cells*, 21, 55 (1987).
Thornton J. A. *Solar Cells*, 21, 41 (1987).
Zweibel K et al, SERI/TR-211-3571, (1989).

What is claimed is:

1. A photovoltaic device for converting light to electrical energy with an n/i/p configuration, comprising:
   a) an n-layer selected from I-III-VI semiconductor compounds;
   b) an i-layer of resistive semiconductor material comprising I-III-VI-VII elements; and
   c) a p-layer selected from I-VI-VII semiconductor compounds.

2. The device of claim 1 wherein the conductivity or doping is graded within the n/i/p structure so that the outer surface of said n-layer is $n^+$, the outer surface p-layer is $p^+$ and the regions adjacent to the i layer on either side are high resistivity n and p, respectively.

3. The device of claim 1 wherein at least one layer is in the form of a thin film.

4. The device of claim 1 further including an ohmic contact material to said n-layer which comprises at least one group III element.

5. The device of claim 1 wherein said n-layer, i-layer, and p-layer include n-CuInSe$_2$, CuIn$_X$Se$_Y$I$_Z$, and CuISe$_3$, respectively.

6. The device of claim 1 wherein at least one layer is deposited on an ohmically contacted flexible substrate.

7. A multijunction device of claim 1 used in cascade configuration with other semiconductor materials.

8. The device of claim 1 wherein said p-layer and said i-layer are synthesized by selenization and iodization of a group I element and of I-III alloys, respectively.

9. The device of claim 1 where a n-CuInSe$_2$/CuIn$_X$Se$_Y$I$_Z$/p-CuISe$_3$ heterojunction is produced by electro chemically converting the surface of n-CuInSe$_2$ to CuIn$_X$Se$_Y$I$_Z$/p-CuISe$_3$.

10. The device of claim 1 wherein at least one layer is produced from a stoichiometric melt of its constituents.

11. The device of claim 1 where the layers are deposited in a continuous process in an integrated deposition system.

12. A photovoltaic device for converting light to electrical energy, comprising:

a) an n-layer selected from I-III-VI$_2$ semiconductor compounds, and b) a p-layer selected from I-VI$_3$-VII semiconductor compounds.

13. The device of claim 12 wherein said n-type layer is gradient doped and the n-type conductivity and the conductivity grading is induced by diffusion of group III metal from the back ohmic contact into the n-layer.

14. The device of claim 12 wherein at least one component is synthesized by electrodeposition.

15. The device of claim 12 wherein the constituents of at least one layer are deposited by evaporation.

16. The device of claim 12 wherein at least one layer is synthesized by a vapor deposition technique.

17. The device of claim 12 wherein at least one layer is deposited by spray pyrolysis.

18. The device of claim 12 wherein said n-layer is synthesized by selenization of I-III alloy.

19. The device of claim 12 where a heterojunction is formed by electrochemically reacting the surface of said n-layer, to produce said p-type layer.

20. A photovoltaic device comprising:

a) an absorber material selected from the I-III-VI$_2$ semiconductor compounds, and b) a relatively wide bandgap heterojunction partner selected from I-III-VI-VII compounds.

* * * * *